United States Patent
Cartina et al.

(10) Patent No.: US 11,005,690 B1
(45) Date of Patent: May 11, 2021

(54) METHOD AND DEVICE FOR DIGITAL COMPENSATION OF DYNAMIC DISTORTION IN HIGH-SPEED TRANSMITTERS

(71) Applicant: INPHI CORPORATION, Santa Clara, CA (US)

(72) Inventors: Dragos Cartina, Burnaby (CA); Ankit Bhargav, Santa Clara, CA (US); Jamal Riani, Fremont, CA (US); Wen-Sin Liew, Santa Clara, CA (US); Yu Liao, Longmont, CO (US); ChangFeng Loi, Singapore (SG)

(73) Assignee: INPHI CORPORATION, San Jose, CA (US)

( * ) Notice: Subject to any disclaimer, the term of this patent is extended or adjusted under 35 U.S.C. 154(b) by 0 days.

(21) Appl. No.: 16/825,637

(22) Filed: Mar. 20, 2020

(51) Int. Cl.
*H04L 25/03* (2006.01)
*H04L 25/02* (2006.01)
(Continued)

(52) U.S. Cl.
CPC ...... *H04L 25/03859* (2013.01); *G01R 13/345* (2013.01); *G01R 19/2509* (2013.01); *H03F 1/32* (2013.01); *H04L 25/025* (2013.01); *H04L 25/03343* (2013.01); *H04L 25/49* (2013.01); *H03F 2200/66* (2013.01); *H03F 2201/3233* (2013.01)

(58) Field of Classification Search
CPC .............. H04L 25/03859; H04L 25/025; H04L 25/03343; H04L 25/49; G01R 13/345; G01R 19/2509; H03F 1/32; H03F 2200/66; H03F 2201/3233
See application file for complete search history.

(56) References Cited

U.S. PATENT DOCUMENTS

| 5,963,549 | A | * | 10/1999 | Perkins | H04J 13/00 370/206 |
| 6,449,466 | B1 | * | 9/2002 | Jin | H01Q 3/267 455/114.3 |
| 2003/0058959 | A1 | * | 3/2003 | Rafie | H04L 27/368 375/296 |

OTHER PUBLICATIONS

Riley et al., Dynamic compensation of digital to analog converters, "May 1999", IEEE, IMTC/99. Proceedings of the 16th IEEE instrumentation and Measurement Technology Conference. (Year: 1999).*

* cited by examiner

*Primary Examiner* — David S Huang
(74) *Attorney, Agent, or Firm* — Richard T. Ogawa; Ogawa P.C.

(57) ABSTRACT

A device and method of operation for digital compensation of dynamic distortion. The transmitter device includes at least a digital-to-analog converter (DAC) connected to a lookup table (LUT), a first shift register, and a second shift register. The method includes iteratively adjusting the input values via the LUT to induce changes in the DAC output that compensate for dynamic distortion, which depends on precursors, current cursors, and postcursors. More specifically, the method includes producing and capturing average output values for each possible sequence of three symbols using the shift register and LUT configuration. Then, the LUT is updated with estimated values to induce desired output values that are adjusted to eliminate clipping. These steps are performed iteratively until one or more check conditions are satisfied. This method can also be combined with techniques such as equalization, eye modulation, and amplitude scaling to introduce desirable output signal characteristics.

25 Claims, 6 Drawing Sheets

(51) Int. Cl.
*H04L 25/49* (2006.01)
*G01R 19/25* (2006.01)
*G01R 13/34* (2006.01)
*H03F 1/32* (2006.01)

METHOD AND DEVICE FOR DIGITAL COMPENSATION OF DYNAMIC DISTORTION IN HIGH-SPEED TRANSMITTERS

CROSS-REFERENCES TO RELATED APPLICATIONS

N/A

BACKGROUND OF THE INVENTION

The present invention generally relates to communication systems and integrated circuit (IC) devices. More specifically, the present invention provides for a device and method of operation for digital compensation of dynamic distortion in high-speed transmitters.

Over the last few decades, the use of communication networks has exploded. In the early days of the Internet, popular applications were limited to emails, bulletin boards, and mostly informational and text-based web page surfing. The amount of data transferred by such applications was relatively small. Today, the Internet and mobile applications demand a huge amount of bandwidth for transferring photo, video, music, and other multimedia files. For example, a social networking platform can process more than 500 TB of data daily. With such high demands on data storage and data transfer, existing data communication systems need to be improved to address these needs.

To address the need for high-speed data transfer, communication systems require transceiver devices that can transmit and receive data accurately at high rates and low power consumption. However, the transmitter and receiver components of such devices can be affected by numerous impairments that degrade the data signal. Particularly, high-speed transmitters can suffer from impairments, such as distortion, limited bandwidth, insertion losses, reflections, and noise. In some cases, the transmitter suffers from dynamic distortion, which not only depends on current symbols being transmitted but also on previous and subsequent symbols (precursors and postcursors, respectively) as well.

There have been many conventional types of methods and devices for compensation of signal impairments in transmitters. Unfortunately, they have been inadequate to address dynamic distortion. Therefore, improved communication systems with devices and methods for compensation of dynamic distortion in high-speed transmitters are highly desired.

BRIEF SUMMARY OF THE INVENTION

The present invention generally relates to communication systems and integrated circuit (IC) devices. More specifically, the present invention provides for a device and method of operation for digital compensation of dynamic distortion in high-speed transmitters. Merely by way of example, the present invention is applied to a 4-level pulse amplitude modulation (PAM4) transmitter. However, the present invention has a much broader range of applicability, such as other PAM-type transmitters, amplitude modulation (AM) type transmitters, AM transceivers, AM communication systems, and the like.

According to an example, the present invention provides for a method of operating a transmitter device having a digital-to-analog converter (DAC) configured to a lookup table (LUT), a first shift register, and a second shift register. This method uses a digital compensation technique to address dynamic distortion, a type of distortion that affects a transmitted signal that is also dependent on previously transmitted symbols (precursors) and subsequently transmitted symbols (postcursors). This method can also be combined with techniques such as equalization, eye modulation, and amplitude scaling to introduce desirable characteristics to the output signal.

In an example, the method includes producing and capturing initial transmitter output values. The LUT can be filled with a set of starting values configured to produce a valid waveform at the output of the DAC. Then, an input signal pattern is sent through the DAC to produce an output waveform that is captured by a recording device (e.g., on-chip receiver, oscilloscope, etc.). The LUT starting values can span the full range of the DAC output, and the signal pattern can be any random signal pattern.

In an example, the method includes processing the initial output values to update the values in the LUT. From the captured output waveform, the average output value is determined for each possible sequence of three symbols at the input. These average output values can be sampled from the middle of the eye of the output waveform. A desired output incorporating desired characteristics (e.g., equalization, eye modulation, amplitude scaling, etc.) is determined for each possible sequence, and the desired output is adjusted (i.e., shifted and scaled) to avoid clipping at the upper and lower ends. Afterwards, the LUT values are updated according to the adjusted desired output using a least mean squared (LMS) algorithm. These updated LUT values represent estimated compensation values that will take the DAC output from the initial average output to the adjusted desired output.

In an example, the method includes iteratively producing and capturing average output values, and then iteratively updating the values in the LUT according to the previous steps until one or more check conditions are satisfied. Such check conditions can include a target signal to noise and distortion ratio (SDNR), requirements for desired signal characteristics, and the like. Those of ordinary skill in the art will recognize other variations, modifications, and alternatives.

According to an example, the present invention provides for a transmitter device configured to perform the dynamic distortion compensation techniques as described previously. The transmitter device can include at least a DAC coupled to an LUT configured with a first shift register and a second shift register. These shift registers are configured to provide delayed copies of the input signal to address the transmitted precursor, current cursor, and postcursor symbols discussed previously. The LUT adjusts the input values to the DAC to induce desired changes (according to the method above) to the input signal until desired check conditions are met. This transmitter device can be incorporated into a transceiver device, a communication system, or the like. Of course, there can be other variations, modifications, and alternatives.

Many benefits are recognized through various embodiments of the present invention. Such benefits include low-power compensation techniques for dynamic distortion at the transmitter output. These techniques can be implemented in combination with other techniques to introduce desirable signal characteristics, such as equalization, eye modulation, amplitude scaling, and the like. Further, the present invention provides for a low-complexity architecture to implement such techniques in a transmitter device, transceiver device, or communication system, and the like. Other such benefits will be recognized by those of ordinary skill in the art.

The present invention achieves these benefits and others in the context of known data transmission technologies. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1:
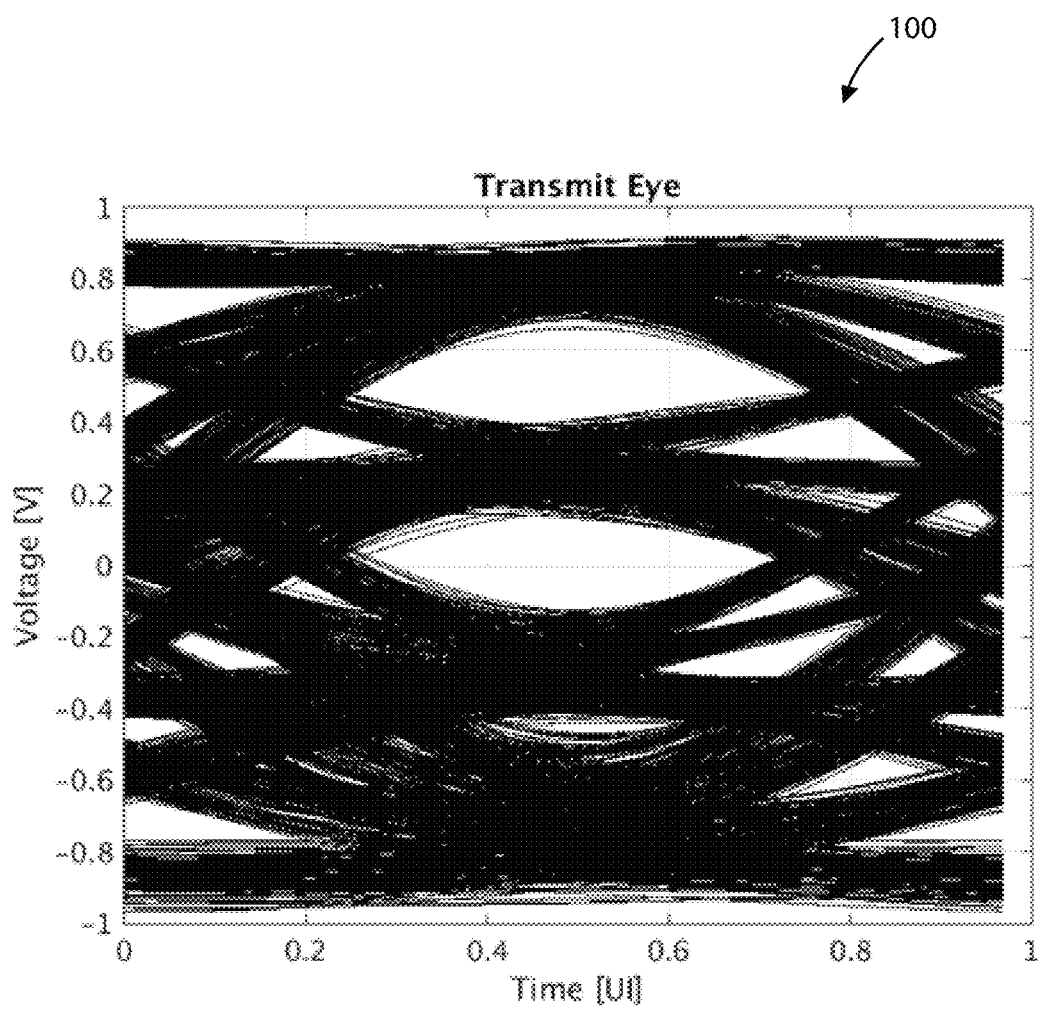
FIG. 1 is an example 4-level pulse amplitude modulation (PAM4) eye diagram showing the effects dynamic distortion.

The present invention generally relates to communication systems and integrated circuit (IC) devices. More specifically, the present invention provides for a device and method of operation for digital compensation of dynamic distortion in high-speed transmitters. Merely by way of example, the present invention is applied to a 4-level pulse amplitude modulation (PAM) transmitter. However, the present invention has a much broader range of applicability, such as other PAM-type transmitters, quadrature amplitude modulation (QAM) transmitters, amplitude modulation (AM) type transmitters, AM transceivers, AM communication systems, and the like.

As explained above, high-speed transmitters can be affected by numerous impairments such as distortion, limited bandwidth, insertion losses, reflections, and noise. In some cases, such as in large-signal single-ended transmitters, the distortion depends not only on the symbol being transmitted, but also on previously and subsequently transmitted symbols (i.e., precursors and postcursors, respectively). We call this type of distortion "dynamic distortion", and we note that it is different from static distortion, which depends only on the symbol being transmitted. Dynamic distortion is also different from linear impairments, which may introduce linear dependence on precursors and postcursors but will not introduce distortion. As a result, dynamic distortion cannot be addressed with established techniques, such as static predistortion or equalization.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

FIG. 1 is an example 4-level pulse amplitude modulation (PAM4) eye diagram showing the effects dynamic distortion. An extreme case for a PAM4 transmitter is shown in eye diagram 100 where the falling edge is much slower than the rising edge, which results in the bottom PAM4 eye being closed.

Figure 2:
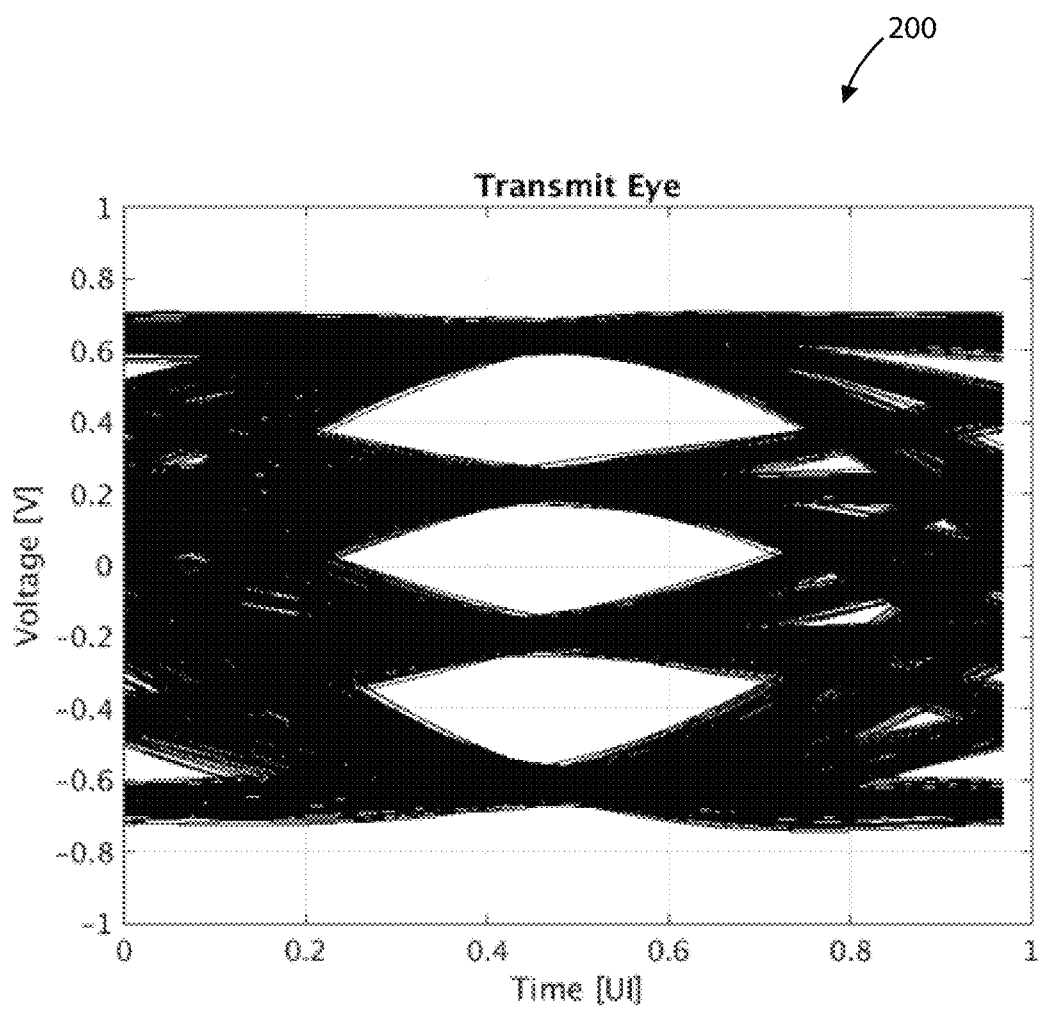
FIG. 2 is an example PAM4 eye diagram showing the effects of dynamic distortion compensation according to an example of the present invention.

FIG. 2 is an example PAM4 eye diagram showing the effects of dynamic distortion compensation according to an example of the present invention. For comparison purposes, the transmit eye in eye diagram 200 has much less dynamic distortion and is more likely to provide good performance for a data link.

As shown by the comparisons of FIGS. 1 and 2, it is highly desirable to implement compensation techniques to address dynamic distortion in transmitter devices. This distortion can sometimes be addressed with analog techniques at the cost of increased power consumption, but often such analog techniques are not effective at very high frequencies. Thus, the present invention uses digital compensation techniques that will be effective for high-speed transmitters operating at very high frequencies.

In an example, the present invention provides a digital compensation method to remove dynamic distortion from the transmitter output. This method can be further enhanced to introduce certain desirable characteristics into the output signal, such as precursor or postcursor equalization, eye modulation, amplitude scaling, or the like. Merely by way of example, this method assumes a PAM4 modulation scheme. However, this method can be applied to transmitters using any type of amplitude modulation (AM) scheme, such as other types of PAM schemes, quadrature amplitude modulation (QAM), and the like. An example derivation of the digital compensation method is discussed in further detail below.

Figure 3A:
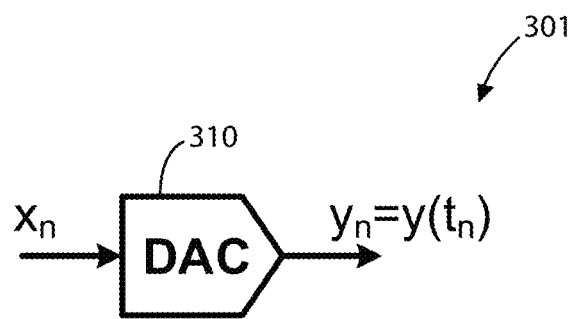
FIG. 3A is a simplified block diagram illustrating a conventional transmitter device implemented as a digital-to-analog converter (DAC).
Figure 3B:
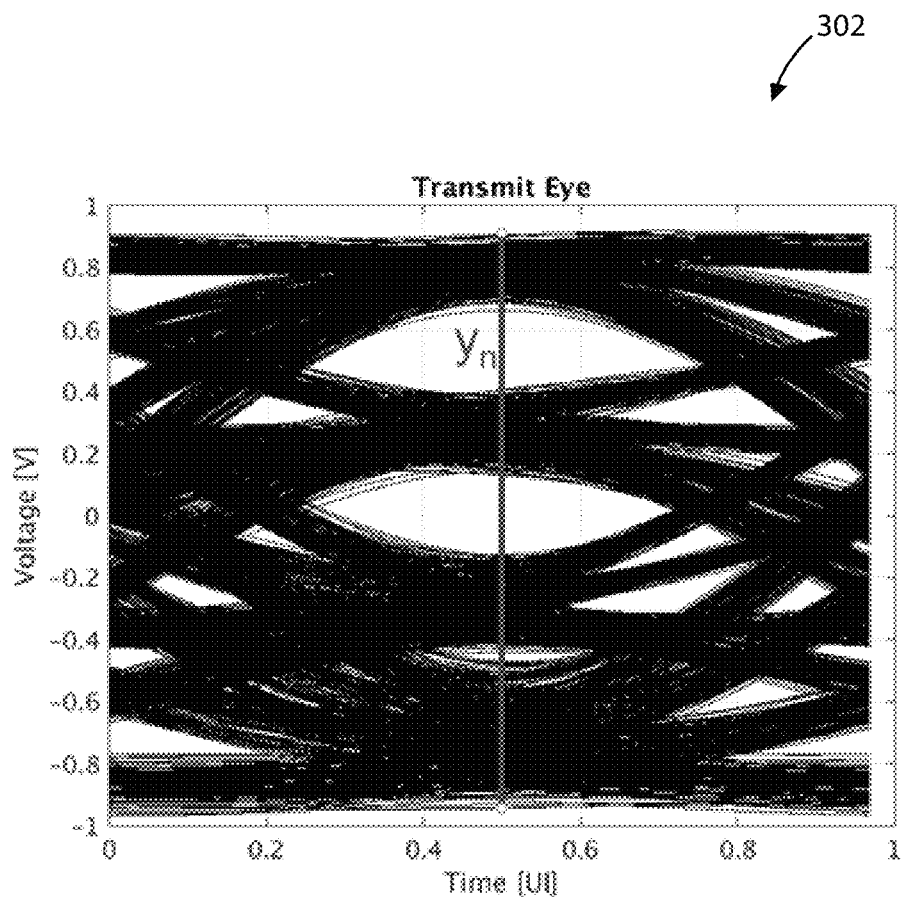
FIG. 3B is an example eye diagram illustrating corresponding to the transmitter device shown in FIG. 3A.

FIG. 3A is a simplified block diagram illustrating a conventional transmitter device 301. Without loss of generality, let us assume that the transmitter 301 is implemented as a digital-to-analog converter (DAC) 310, which turns input digital codes $x_n$ into an output waveform y(t). FIG. 3B is an eye diagram 302 corresponding to the output of transmitter 301. This output waveform y(t) can then be sampled at times $t_n$ in the middle of the eye to yield samples $y_n$ (as shown in FIG. 3B). Also, without loss of generality, let us assume that the transmitter 301 is sending PAM4 signals.

Ideally, the output voltage $y_n$ at time $t_n$ should only be a function of the input code $x_n$:

$$y_n = y(x_n)$$

In practice, the output voltage depends on multiple precursors and postcursors:

$$y_n = y[x_{n-l}, x_{n-l+1}, \ldots, x_n, \ldots, x_{n+k-1}, x_{n+k}] + \varepsilon_n$$

Here, $x_{n-l}, x_{n-l+1}, \ldots x_{n-1}$ are precursors and $x_{n+1}, \ldots, x_{n+k-1}, x_{n+k}$ are postcursors, and $\varepsilon_n$ is the residual error, which can be due to noise or other impairments not correlated with the signal. Without loss of generality, let us assume that the output voltage is a function of a single precursor and a single postcursor:

$$y_n = y[x_{n-1}, x_n, x_{n+1}] + \varepsilon_n$$

To compensate for dynamic distortion, we need a method that removes the part of the distortion that is dependent on $x_{n-1}$ and $x_{n+1}$ (i.e., the precursor and postcursor components, respectively). According to an example of the present invention, the method can involve calculating the average value of each possible sequence in the transmission signal.

For each possible sequence of three symbols at the input $(X_{-1}, X_0, X_{+1})$, let us define $\bar{y}[X_{-1}, X_0, X_{+1}]$ as the average value of $y_n$ when $x_{n-1}=X_{-1}$, $x_n=X_0$, and $x_{n+1}=X_{+1}$. For example, suppose we have a long continuous-time output y(t) that we sample in the middle of the eye to obtain samples $y_n$ (as shown in FIG. 3B). From the sampled output $y_n$, we can select just instances where three consecutive samples correspond to input values $(X_{-1}, X_0, X_{+1})$ and for these instances we can average the cursor output $y_n$ to calculate $\bar{y}[X_{-1}, X_0, X_{+1}]$. As an example, in the case of PAM4 transmission with no equalization, each of $X_{-1}, X_0$, and $X_{+1}$ can take one of four possible values. Hence, there are $4^3=64$ possible sequences, and we can define an average value $\bar{y}[X_{-1}, X_0, X_{+1}]$ for each of these $4^3$ sequences.

Using these average values, we need to change the output signal to remove undesirable characteristics (i.e., dynamic distortion) and introduce other desirable characteristics (precursor or postcursor equalization, eye modulation, or amplitude scaling). Let us define the desired output voltage values that have said desirable characteristics as $\tilde{y}[X_{-1}, X_0, X_{+1}]$. Preferably, we should generate $\tilde{y}[X_{-1}, X_0, X_{+1}]$ without modifying the analog circuitry since that would entail increased power and design complexity and the desired performance may not even be achievable for very high data rates. Instead, we can adjust the input values to the DAC in such a way as to induce the required changes on the transmit signal at the DAC output. This can be done with a shift register and a look-up table (LUT), as shown in FIG. 4.

Figure 4:
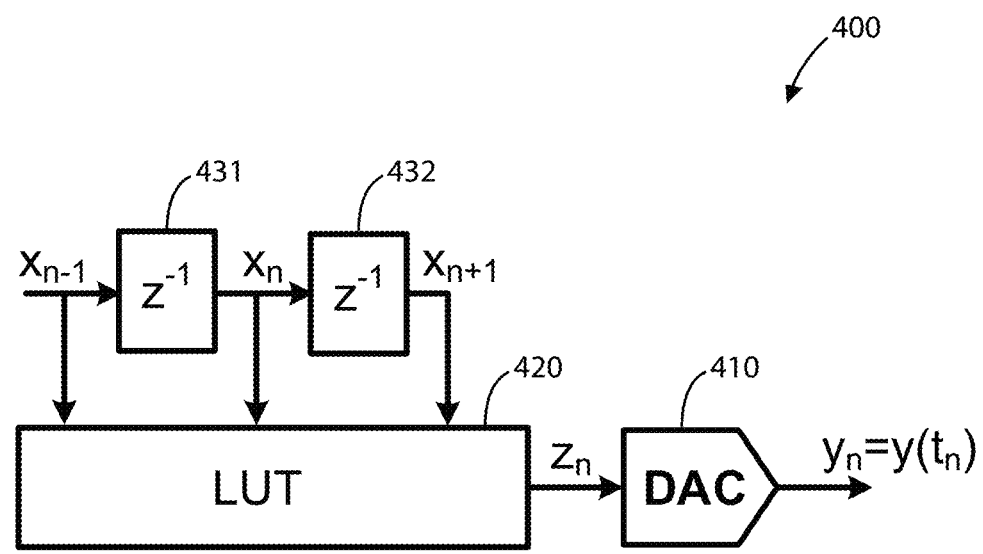
FIG. 4 is simplified block diagram illustrating a transmitter device according to an example of the present invention.

FIG. 4 is a simplified block diagram illustrating a transmitter device according to an example of the present invention. As shown, device 400 includes a DAC 410, an LUT 420, and shift registers 431, 432. The LUT 420 is coupled to the DAC 410 and configured to receive an input signal along with delayed input signals from the shift registers 431, 432.

In an example, the input is passed through the shift registers 431, 432 to generate delayed copies of the signal $(x_{n-1}, x_n$, and $x_{n+1})$, which are then used to index the LUT 420. Through this indexing, the LUT 420 is configured with values or codes that can compensate for dynamic distortion and introduce said desirable characteristics. In a specific example, for each possible input sequence $(X_{-1}, X_0, X_{+1})$, the LUT stores codes that cancel the effects of dynamic distortion in the DAC 410.

In other examples, the transmitter device 400 can include additional circuit components configured before or after the LUT-DAC configuration. Additional circuit components may be connected between the LUT and the DAC as well. The circuit components can include various filters, amplifiers, mixers, and the like and combinations thereof. In such cases, the functionality of the LUT-DAC configuration remains the same. These examples of the transmitter device 400 can also be configured within a transceiver device or in a broader communication system or the like. Those of ordinary skill in the art will recognize variations, modifications, and alternatives to the configuration shown in FIG. 4.

Although LUTs are used to apply equalization, eye modulation or amplitude scaling, examples of the present invention use the LUT to perform more powerful signal processing, including dynamic distortion compensation.

For instance, linear equalization can be implemented as:

$$z[X_{-1}, X_0, X_{+1}] = a_{-1} \cdot X_{-1} + a_0 \cdot X_0 + a_1 \cdot X_{+1}$$

and eye modulation and amplitude scaling can be implemented as:

$$z[X_{-1}, X_0, X_{+1}] = c(X_0)$$

These two equations can be combined into the following equation:

$$z[X_{-1}, X_0, X_{+1}] = a_{-1} \cdot c(X_{-1}) + a_0 \cdot c(X_0) + a_1 \cdot c(X_{+1})$$

From this equation, we can see that linear equalization, eye modulation, and amplitude scaling introduce certain relationships between the elements of the LUT. For example, for eye modulation all $z[X_{-1}, X_0, X_{+1}]$ entries for a given $X_0$ value are identical. On the other hand, for dynamic distortion compensation, it is important that each LUT entry is independently set.

Let us first calculate the desired output voltage $\tilde{y}[X_{-1}, X_0, X_{+1}]$ including the required equalization, eye modulation, and amplitude scaling, using an equation similar to the one above:

$$\tilde{y}[X_{-1}, X_0, X_{+1}] = a_{-1} \cdot c(X_{-1}) + a_0 \cdot c(X_0) + a_1 \cdot c(X_{+1})$$

The desired output must be shifted and scaled to make use of the available range of the DAC without clipping. For example, assuming a 7-bit DAC, no codes can be lower than 0 and no codes can be higher than 127. Therefore, we need to identify the sequences most likely to clip. Assuming that the output can have both positive and negative values, clipping at the upper end is most likely to occur for the sequence that has the main cursor $(X_0)$ set to the top PAM4 level. In addition, this sequence has the maximum ratio $\tilde{y}[X_{-1}, X_0, X_{+1}]/\bar{y}[X_{-1}, X_0, X_{+1}]$. Let us define $y_{max} = \bar{y}[X_{-1}, X_0, X_{+1}]$ for this sequence most likely to clip at the upper end.

Similarly, clipping at the lower end is most likely to occur for the sequence that has the main cursor ($X_0$) set to the bottom PAM4 level. This sequence also has the maximum ratio $\tilde{y}[X_{-1}, X_0, X_{+1}]/\bar{y}[X_{-1},X_0,X_{+1}]$. Let us define $y_{min} = \bar{y}[X_{-1}, X_0, X_{+1}]$ for this sequence most likely to clip at the lower end.

Once $y_{max}$ and $y_{min}$ are identified, the signal can be easily shifted and scaled to fit the available range without clipping as follows:

$$\hat{y}[X_{-1}, X_0, X_{+1}] = $$
$$\frac{S \cdot \tilde{y}[X_{-1}, X_0, X_{+1}]}{\max(\tilde{y}[X_{-1}, X_0, X_{+1}]) - \min(\tilde{y}[X_{-1}, X_0, X_{+1}])} \cdot (y_{max} - y_{min}) + $$
$$\frac{1}{2} \cdot (y_{max} + y_{min})$$

where S is the desired scaling factor and $\hat{y}[X_{-1}, X_0, X_{+1}]$ is the desired output voltage for each sequence, after scaling and shifting.

The next step is to estimate the required LUT entries $z[X_{-1}, X_0, X_{+1}]$ that take the output from the initial $\bar{y}[X_{-1},X_0,X_{+1}]$ values to the desired values $\hat{y}[X_{-1},X_0,X_{+1}]$. In an example, this can be done using the LMS algorithm as follows:

$$z_{k+1}[X_{-1},X_0,X_{+1}] = z_k[X_{-1},X_0,X_{+1}] + \mu \cdot (\hat{y}[X_{-1},X_0,X_{+1}] - \bar{y}[X_{-1},X_0,X_{+1}])$$

where $\mu$ is the convergence coefficient.

Figure 5A:
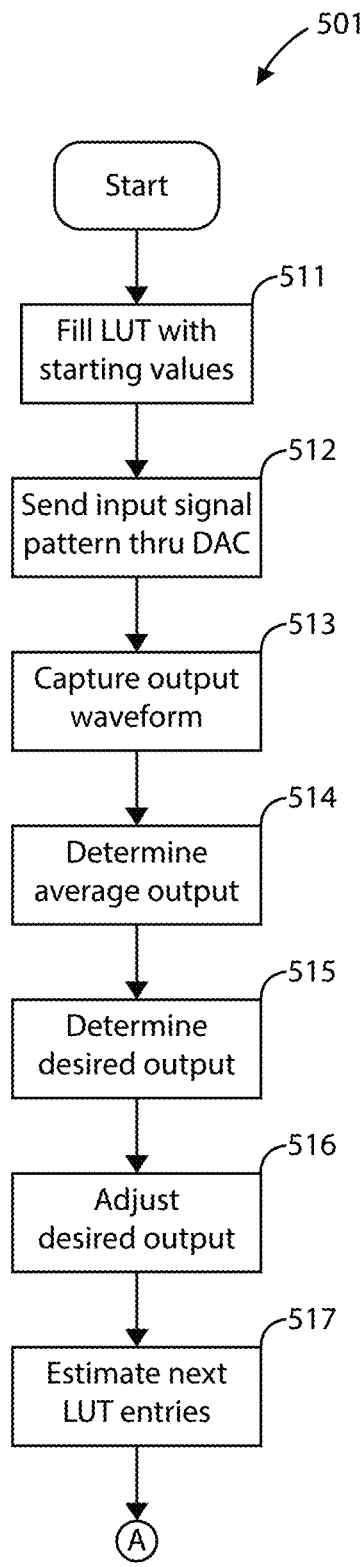
FIGS. 5A and 5B are simplified flow diagrams illustrating a method for digital compensation of dynamic distortion according to an example of the present invention.
Figure 5B:
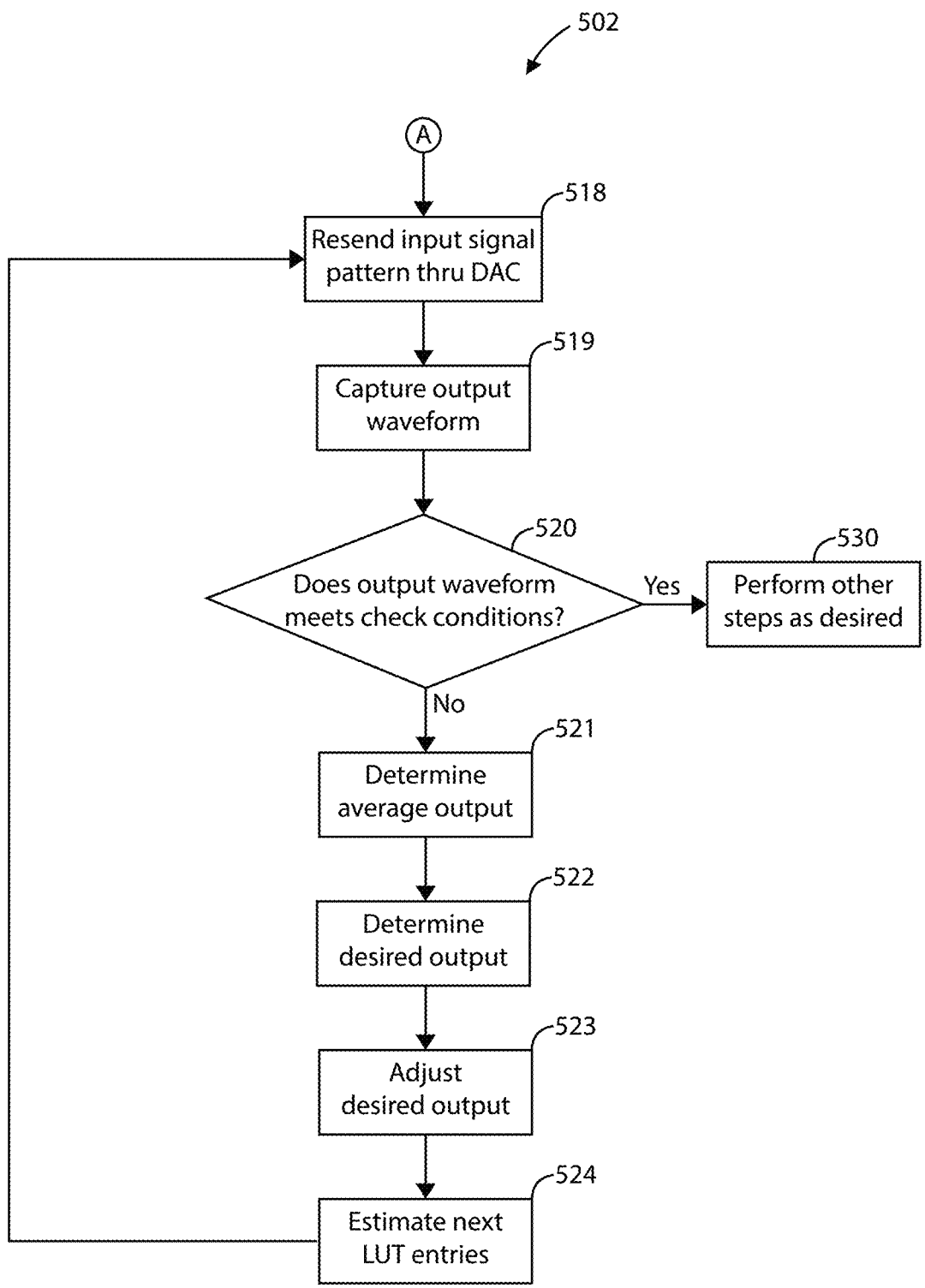

FIGS. 5A and 5B are simplified flow diagrams illustrating a method for digital compensation of dynamic distortion according to an example of the present invention. As shown, flow diagram 501 of FIG. 5A connects to flow diagram 502 of FIG. 5B by the connector "A". From the steps described above, we can now define the full procedure according to an example of the present invention as follows:
1. Fill the LUT with a set of starting values configured to produce valid waveforms at the output of the DAC (flow diagram step 511). Generally, it is best to exercise the whole range of the DAC at this step. For example, in the case of using a PAM4 coding scheme with a 7-bit DAC, we can fill the LUT with $z[*, X_0, *] = 0/43/85/127$.
2. Send an input signal pattern $x_n$ through the DAC (flow diagram step 512). This signal pattern can be any random signal pattern (e.g., higher-order PRBS for PAM4).
3. Capture the output waveform with a recording device (flow diagram step 513). This recording device can be an on-chip receiver or test equipment, such as a digital scope, or the like.
4. Determine the average output value $\bar{y}[X_{-1}, X_0, X_{+1}]$ for each possible sequence of three symbols at the input (flow diagram step 514). These average output values can be sampled from the middle of the eye of the output waveform.
5. Determine the desired output $\tilde{y}[X_{-1},X_0,X_{+1}]$ for each of these possible sequences (flow diagram step 515). The desired output calculation can include techniques for linear equalization, eye modulation, amplitude scaling, and the like and combinations thereof.
6. Adjust the desired output to $\hat{y}[X_{-1}, X_0, X_{+1}]$ for all possible sequences to eliminate the risk of clipping (flow diagram step 516). This adjustment includes determining the sequences most likely to clip at the upper end and the lower end. Afterwards, the adjusted desired output can be determined by the calculation discussed previously.
7. Estimate the next iteration of LUT entries $z_{k+1}[X_{-1}, X_0, X_{+1}]$ that will take the output from the initial average output to the adjusted desired output (flow diagram step 517). As discussed above, the LUT entries can be estimated using an LMS algorithm. However, this step may use other algorithms, such as recursive least squares (RLS), Affine Projection (AP), and the like.
8. Send the same input signal pattern $x_n$ as before through the DAC, as described in step 2 (flow diagram step 518).
9. Capture the output waveform using the recording device, as described in step 3 (flow diagram step 519).
10. Check whether the output waveform meets one or more check conditions (flow diagram step 520). These check conditions can include whether the output waveform has low enough distortion (e.g., by measuring signal to noise and distortion ratio (SNDR)) and additionally meets the requirements of equalization, eye modulation and scaling set out in the beginning. Other check conditions can include eye height (i.e., eye opening), bit error rate (BER), level separation mismatch ratio (RLM), transmission dispersion and eye closure quaternary (TDECQ), and the like. If the desired check conditions are not satisfied, the process can be repeated starting from step 4 (shown by flow diagram steps 521, 522, 523, and 524). In practice, iterations may be required because dynamic distortion changes as the LUT is adapted.
11. Perform other steps, as desired (flow diagram step 530).

The above sequence of steps is used to perform a method for digital compensation of dynamic distortion according to one or more embodiments of the present invention. Depending upon the embodiment, one or more of these steps can be combined, or removed, or other steps may be added without departing from the scope of the claims herein. One of ordinary skill in the art will recognize variations, modifications, and alternatives.

In an example, the method steps described above can be performed via hardware by a digital signal processor (DSP) electrically coupled to the LUT, the DAC, and the recording device. The DSP can also be programmed to perform these method steps via firmware stored in a non-volatile memory (NVM) device (e.g., read-only memory (ROM), erasable read-only memory (EPROM), flash memory, etc.) configured within the transmitter device or encompassing communication device. The DSP can also be implemented directly in the recording device (e.g., in the receiver) and the LUT updates can be communicated back to the transmitter device by means of a back channel, where available. Or, these methods steps can also be performed by software, such as by a computing system with test equipment (e.g., digital scope) connected to the transmitter device to implement the steps described previously. Of course, there can be other variations, modifications, and alternatives.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method of operating a transmitter device for dynamic distortion compensation, the method comprising:
   providing a lookup table (LUT) of the transmitter device with a plurality of starting values;
   sending an input signal pattern through the LUT to a digital-to-analog converter (DAC) of the transmitter device to produce an initial output waveform;
   capturing the initial output waveform from the DAC using a recording device;
   determining an initial average output value using the captured initial output waveform for each possible sequence of three input symbols;
   determining an initial desired output value using the initial average output for each possible sequence of three input symbols;
   adjusting the initial desired output values to eliminate clipping;
   determining and storing, in the LUT, an initial estimated LUT value for each possible sequence of three input symbols that changes the initial average output value corresponding to the same sequence of three input symbols to the adjusted initial desired output value corresponding to the same sequence of three input symbols; and
   iteratively performing, until one or more check conditions are met, the following:
      sending the input signal pattern through the LUT to the DAC to produce a subsequent output waveforms;
      capturing the subsequent output waveform using the recording device;
      determining a subsequent average output value using the captured subsequent output waveform for each possible sequence of three input symbols;
      determining a subsequent desired output value using the subsequent average output for each possible sequence of three input symbols;
      adjusting the subsequent desired output values to eliminate clipping; and
      determining and storing, in the LUT, a subsequent estimated LUT value in the LUT for each possible sequence of three input symbols that changes the subsequent average output value corresponding the same sequence of three input symbols to the adjusted subsequent desired output value corresponding to the same sequence of three input symbols;
   wherein the transmitter includes a first shift register configured with the LUT to produce a first delayed input signal pattern and a second shift register configured with the LUT to produce a second delayed input signal pattern; and
   wherein the input signal pattern, the first delayed input signal pattern, and the second delayed input signal pattern are used to provide each possible sequence of three input symbols used to determine the initial and subsequent average output values, the initial and subsequent desired output values, adjust the initial and subsequent desired output values, and determine the initial and subsequent estimated LUT values.

2. The method of claim 1 wherein the starting values in the LUT span a full range of possible values for the DAC and are configured to produce valid waveforms.

3. The method of claim 1 wherein the recording device includes an on-chip receiver or a digital scope.

4. The method of claim 1 wherein determining the initial average output values, determining the initial desired output values, adjusting the initial desired output values, determining the initial estimated LUT values, determining the subsequent average output values, determining the subsequent desired output values, adjusting the subsequent desired output values, and determining the subsequent estimated LUT values are performed by a digital signal processor (DSP) of the recording device; and
   wherein storing the initial estimated LUT values and the subsequent estimated LUT values in the LUT comprises communicating, by the DSP of the recording device, the initial estimated LUT values and the subsequent estimated LUT values over a back channel configured between the transmitter device and the recording device.

5. The method of claim 1 wherein determining the initial average output values includes sampling the initial output waveform in a middle of an eye portion of the initial output waveform; and determining the subsequent average output values includes sampling the subsequent output waveform in the middle of an eye portion of the subsequent output waveform.

6. The method of claim 1 wherein determining the initial desired output values and the subsequent desired output values includes applying linear equalization, eye modulation, and amplitude scaling for each sequence of three input symbols.

7. The method of claim 1
   wherein adjusting the initial desired output values includes
      determining a sequence of three input symbols that is most likely to clip at an upper end of the initial output waveform;
      determining a sequence of three input symbols that is most likely to clip at a lower end of the initial output waveform; and
      shifting and scaling the initial desired output values according to the sequences most likely to clip at the upper and lower ends; and
   wherein adjusting the subsequent desired output values includes
      determining a sequence of three input symbols that is most likely to clip at an upper end of the subsequent output waveform;
      determining a sequence of three input symbols that is most likely to clip at a lower end of the subsequent output waveform; and
      shifting and scaling the subsequent desired output values according to the sequences most likely to clip at the upper and lower ends.

8. The method of claim 1 wherein determining the initial estimated LUT values and the subsequent estimated LUT values includes applying a least mean squared (LMS) algorithm, a recursive least squares (RLS) algorithm, or an Affine Projection (AP) algorithm.

9. The method of claim 1 wherein the one or more check conditions includes a target signal to noise and distortion ratio (SNDR), eye height, bit error rate (BER), level separation mismatch ratio (RLM), or transmission dispersion and eye closure quaternary (TDECQ).

10. A method of dynamic distortion compensation, performed by a transmitter device, the method comprising:
   providing a lookup table (LUT) of the transmitter device with a plurality of starting values;
   iteratively performing, until one or more check conditions are met, the following:
      sending an input signal pattern through the LUT to a digital-to-analog converter (DAC) of the transmitter device to produce an output waveform;

capturing the output waveform from the DAC using a recording device;

determining an average output value using the captured output waveform for each possible sequence of three input symbols;

determining a desired output value using the average output for each possible sequence of three input symbols;

adjusting the desired output values to eliminate clipping; and determining and storing, in the LUT, an estimated LUT value for each possible sequence of three input symbols that changes the average output value corresponding to the same sequence of three input symbols to the adjusted desired output value corresponding to the same sequence of three input symbols;

wherein the transmitter includes a first shift register configured with the LUT to produce a first delayed input signal pattern and a second shift register configured with the LUT to produce a second delayed input signal pattern; and wherein the input signal pattern, the first delayed input signal pattern, and the second delayed input signal pattern are used to provide each possible sequence of three input symbols used to determine the initial and subsequent average output values, the initial and subsequent desired output values, adjust the initial and subsequent desired output values, and determine the initial and subsequent estimated LUT values.

11. The method of claim 10 wherein the starting values in the LUT span a full range of possible values for the DAC and are configured to produce valid waveforms.

12. The method of claim 10 wherein the recording device includes an on-chip receiver or a digital scope.

13. The method of claim 10 wherein determining the average output values, determining the desired output values, adjusting the desired output values, and determining the estimated LUT values are performed by a digital signal processor (DSP) of the recording device; and wherein storing the estimated LUT values in the LUT comprises communicating, by the DSP of the recording device, the estimated LUT values over a back channel configured between the transmitter device and the recording device.

14. The method of claim 10 wherein determining the average output values includes sampling the output waveform in a middle of an eye portion of the output waveform.

15. The method of claim 10 wherein determining the desired output values includes applying linear equalization, eye modulation, and amplitude scaling for each sequence of three input symbols.

16. The method of claim 10 wherein adjusting the desired output values includes
determining a sequence of three input symbols that is most likely to clip at an upper end of the output waveform;
determining a sequence of three input symbols that is most likely to clip at a lower end of the output waveform; and
shifting and scaling the desired output values according to the sequences most likely to clip at the upper and lower ends.

17. The method of claim 10 wherein determining the estimated LUT values includes applying a least mean squared (LMS) algorithm.

18. The method of claim 10 wherein the one or more check conditions includes a target signal to noise and distortion ratio (SNDR).

19. A transmitter device, the device comprising:
a lookup table (LUT) having a plurality of LUT entries configured to receive an input signal, the LUT being configured to output an LUT output signal according to the plurality of LUT entries;
a first shift register coupled to the LUT and configured to provide a first delayed input signal to the LUT;
a second shift register coupled to the LUT and configured to provide a second delayed input signal to the LUT;
a digital-to-analog converter (DAC) coupled to the LUT and configured to receive the LUT output signal and to output a DAC output signal;
an on-chip receiver coupled to the DAC and configured to capture the DAC output signal; and
a digital signal processor (DSP) coupled to the LUT, the DAC, and the on-chip receiver; wherein the DSP is configured to provide the LUT with a plurality of starting values in the plurality of LUT entries; and configured to iteratively perform, until one or more check conditions are met, the following:
sending an input signal pattern as the input signal through the LUT to a digital-to-analog converter (DAC) to produce an output waveform in the DAC output signal;
capturing the output waveform from the DAC output signal using the on-chip receiver;
determining an average output value using the captured output waveform for each possible sequence of three input symbols;
determining a desired output value using the average output for each possible sequence of three input symbols;
adjusting the desired output values to eliminate clipping; and
determining and storing, in the plurality of LUT entries, an estimated LUT value for each possible sequence of three input symbols that changes the average output value corresponding to the same sequence of three input symbols to the adjusted desired output value corresponding to the same sequence of three input symbols;
wherein the input signal, the first delayed input signal, and the second delayed input signal are used to provide each possible sequence of three input symbols used to determine the initial and subsequent average output values, the initial and subsequent desired output values, adjust the initial and subsequent desired output values, and determine the initial and subsequent estimated LUT values.

20. The device of claim 19 wherein the DSP is configured to provide the LUT with the starting values that span a full range of possible values for the DAC and that produce valid waveforms.

21. The device of claim 19 wherein the DSP is configured to determine the average output values by sampling the output waveform in a middle of an eye portion of the output waveform.

22. The device of claim 19 wherein the DSP is configured to determine the desired output values includes applying linear equalization, eye modulation, and amplitude scaling for each sequence of three input symbols.

23. The device of claim 19 wherein the DSP is configured to adjust the desired output values by determining a sequence of three input symbols that is most likely to clip at an upper end of the output waveform;

determining a sequence of three input symbols that is most likely to clip at a lower end of the output waveform; and shifting and scaling the desired output values according to the sequences most likely to clip at the upper and lower ends.

24. The device of claim 19 wherein the DSP is configured to determine the estimated LUT values by applying a least mean squared (LMS) algorithm.

25. The device of claim 19 wherein the one or more check conditions includes a target signal to noise and distortion ratio (SNDR).

* * * * *